United States Patent
Su et al.

(10) Patent No.: US 6,724,130 B1
(45) Date of Patent: Apr. 20, 2004

(54) MEMBRANE POSITION CONTROL

(75) Inventors: Ji Su, Highland Park, NJ (US); Joycelyn S. Harrison, Hampton, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 4 days.

(21) Appl. No.: 09/696,523

(22) Filed: Oct. 23, 2000

Related U.S. Application Data
(60) Provisional application No. 60/161,113, filed on Oct. 22, 1999.

(51) Int. Cl.[7] ............................................. H01L 41/08
(52) U.S. Cl. ....................................... 310/330; 310/331
(58) Field of Search .................................. 310/328, 367, 310/368, 330, 331, 332, 324

(56) References Cited

U.S. PATENT DOCUMENTS

| | | | | |
|---|---|---|---|---|
| 1,803,274 A | * | 4/1931 | Sawyer ........................ | 310/330 |
| 2,540,412 A | * | 2/1951 | Adler ........................... | 310/330 |
| 2,842,685 A | * | 7/1958 | Peterman et al. ........... | 310/331 |
| 2,900,536 A | * | 8/1959 | Palo ............................. | 310/330 |
| 3,093,710 A | * | 6/1963 | Eycke .......................... | 310/330 |
| 3,146,367 A | * | 8/1964 | Mcnaney ..................... | 310/331 |
| 3,904,274 A | * | 9/1975 | Feinleib et al. ............. | 310/328 |
| 3,928,778 A | * | 12/1975 | Ivanov et al. ............... | 310/331 |
| 4,246,447 A | * | 1/1981 | Vorie ........................... | 179/110 A |
| 4,330,730 A | * | 5/1982 | Kurz et al. .................. | 310/331 |
| 4,523,120 A | * | 6/1985 | Assard et al. ........... | 310/331 X |
| 4,578,613 A | | 3/1986 | Posthuma de Boer et al. | |
| 4,868,447 A | | 9/1989 | Lee et al. | |
| 5,162,811 A | | 11/1992 | Lammers et al. | |
| 5,338,997 A | * | 8/1994 | Benecke .................. | 310/331 X |
| 5,414,564 A | * | 5/1995 | Pausch et al. ............... | 359/846 |
| 5,440,320 A | | 8/1995 | Lach et al. | |
| 5,598,050 A | * | 1/1997 | Bowen et al. ............... | 310/322 |
| 5,689,380 A | * | 11/1997 | Um ............................. | 310/328 |
| 5,886,811 A | * | 3/1999 | Min ............................. | 359/291 |
| 6,074,067 A | | 6/2000 | Shimada | |
| 6,076,770 A | | 6/2000 | Nygren | |
| 6,098,349 A | | 8/2000 | Zheng | |
| 6,131,698 A | | 10/2000 | Reyland | |
| 6,188,160 B1 | * | 2/2001 | Main et al. .................. | 310/317 |
| 6,293,682 B1 | * | 9/2001 | Kawaguchi ................. | 359/871 |
| 6,297,579 B1 | * | 10/2001 | Martin et al. ............... | 310/330 |

OTHER PUBLICATIONS

Carlin, "Lightweight Mirror Systems for Spacecraft—An Overview of Material & Manufacturing Needs," Sep. 2000, 2000 Areospace Conf. Proc. vol. 4 pp. 169–181.*

Y. Bar–Cohen et al, "NASA/JPL Workshop on Biomorphic Explorers for Future Missions", held at Jet Propulsion Labs, Pasadena, CA, Aug. 19–20, 1998, 22 pgs.

(List continued on next page.)

Primary Examiner—Mark Budd
(74) Attorney, Agent, or Firm—Robin W. Edwards

(57) ABSTRACT

A membrane structure includes at least one electroactive bending actuator fixed to a supporting base. Each electroactive bending actuator is operatively connected to the membrane for controlling membrane position. Any displacement of each electroactive bending actuator effects displacement of the membrane. More specifically, the operative connection is provided by a guiding wheel assembly and a track, wherein displacement of the bending actuator effects translation of the wheel assembly along the track, thereby imparting movement to the membrane.

6 Claims, 4 Drawing Sheets

OTHER PUBLICATIONS

Y. Bar–Cohen et al, SPIE Proceedings, Newport Beach, CA, Paper No. 3669–05, 1999, 6 pgs.

Web page (http://members.aol.com/rhoadkyll2/scifeb1.text, Jul. 25, 2000, 2 pgs.

"Breakthroughs", Discover, Vol 19, No 8, Aug. 1998, 2 pgs.

Y. Bar–Cohen et al., "Electroactive polymers (EAP) low mass musscle actuators", SPIE International Conference, Smart Structures and Materials Symposium, Enabling Technologies: Smart Structures and Integrated Systems, San Diego, CA Mar. 3–6, 1997, 6 pgs.

Y. Bar–Cohen et al., "Flexible, low mass robotic arm actuated by electroactive polymers", SPIE 5th Annual International Symposium on Smart Structures and Materials, Mar. 1–5, 1998, 5 pgs.

R. E. Pelrine, et al, "Electrostriction of polymer dielectrics with compliant electrodes as a means of actuation", Sensors and Actuators A 64, (1998), pp. 77–85.

S. Utku et al, "Shape control of inflatable reflectors", J. Intelligent Material Systems and Structures, vol. 7, Jul. 1995, pp. 550–556.

* cited by examiner

MEMBRANE POSITION CONTROL

CLAIM OF BENEFIT OF PROVISIONAL APPLICATION

Pursuant to 35 U.S.C. §119, the benefit of priority from provisional application No. 60/161,113, with a filing date of Oct. 22, 1999, is claimed for this non-provisional application.

CROSS REFERENCE TO RELATED CASES

This application is related to co-pending, commonly owned patent application Ser. No. 09/696,524, filed Oct. 23, 2000, entitled "Polymer-Polymer Bilayer Actuator", and co-pending, commonly owned patent application Ser. No. 09/696,526, filed Oct. 23, 2000, entitled "Non-Uniform Thickness Electroactive Device."

ORIGIN OF THE INVENTION

The invention described herein was made by an employee of the United States Government and a National Research Council Research Associate and may be used by or for the Government for governmental purposes without the payment of any royalties thereon or therefor.

BACKGROUND OF THE INVENTION

1. Field of the Invention

The present invention is generally related to the control of membrane structures by electroactive bending actuators.

2. Description of the Related Art

Membrane inflatable and deployable space structures are widely employed by the government and commercially as reflectors, antennas, solar arrays, satellites, solar sails, etc. Although these membrane inflatable and deployable structures are widely used, many challenges exist which limit their performance for high precision applications. Factors affecting precision include surface smoothness, deviation from desired surface profile, surface deformations due to thermal fluctuations, and accurate membrane positioning. Actuation devices are used for many applications, including the shaping, tuning, positioning, controlling and deforming of membrane structures. To operate most effectively in the aforementioned applications, actuation devices require sufficient force and strain, and often need to produce complex motions.

Conventional piezoelectric ceramic, polymer, and composite actuators (including piezoelectric, electrostrictive, and electrostatic) lack the combination of sufficient strain and force to most effectively perform the aforementioned functions. Previous concepts for shaping and tuning membrane structures have primarily involved the use of piezoelectric ceramic materials. These ceramic piezoelectrics have the major problems of large mass, high density, low strain and high brittleness. Generally, piezoceramics also need additional mechanical devices to achieve a shaping, tuning, positioning, controlling or deforming function. In contrast to electroceramics, electroactive polymers are emerging as new actuation materials due to their enhanced strain capabilities.

SUMMARY OF THE INVENTION

Accordingly, an object of the present invention is to provide an electroactive position control device.

Another object is to provide an electroactive position control device wherein the electroactive components have small mass, low density, high strain and low brittleness.

Another object is to provide an electroactively-controlled membrane.

Another object is to provide an electroactively-controlled membrane inflatable and deployable structure.

Another object is to provide an electroactive position control device using electrostrictive bending actuators.

Additional objects and advantages of the present invention are apparent from the drawings and specification that follow.

In accordance with the present invention, a membrane structure includes an electroactive device fixed to a supporting base. A connection means operatively connects the electroactive device to the membrane for controlling membrane position.

BRIEF DESCRIPTION OF THE INVENTION

A more complete appreciation of the invention and the many of the attendant advantages thereof will be readily attained as the same becomes better understood by reference to the following detailed description when considered in connection with the accompanying drawings, wherein.

DETAILED DESCRIPTION OF THE INVENTION

Figure 1:
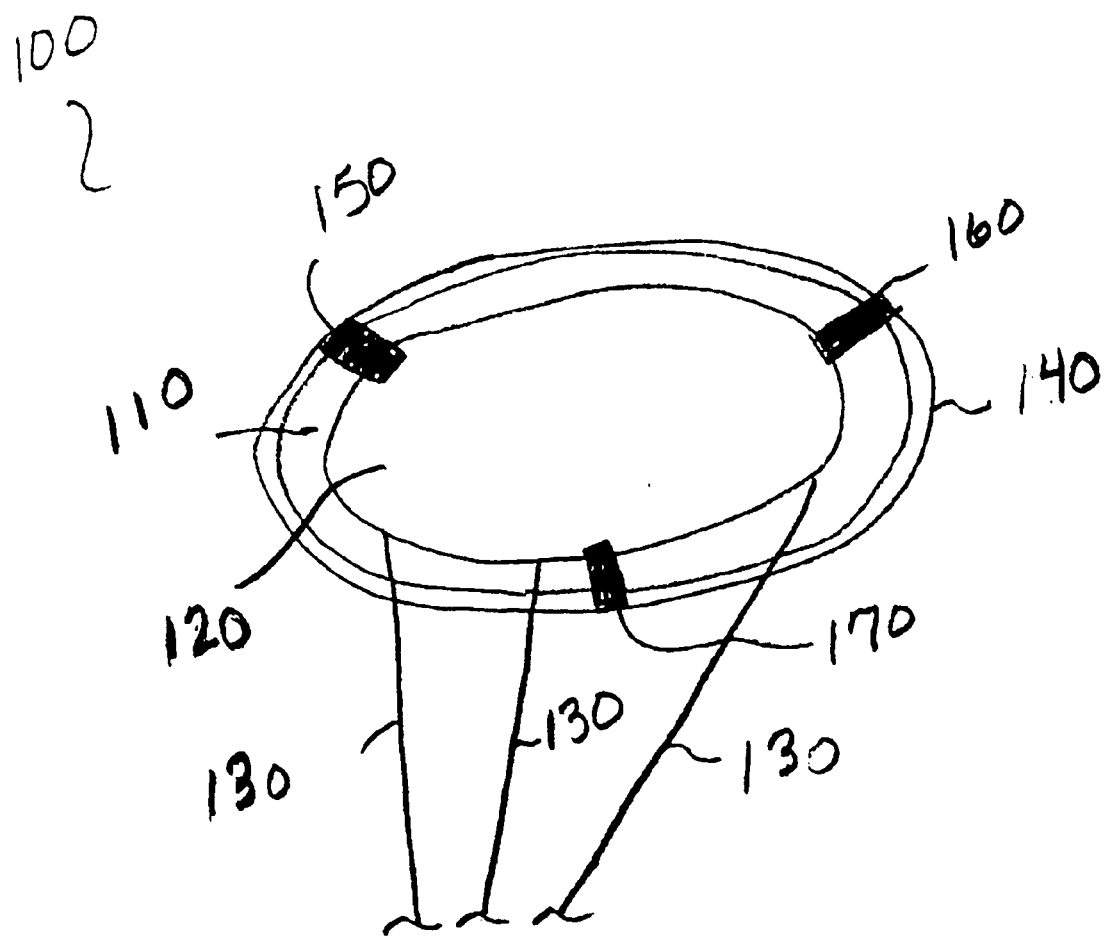
FIG. 1 illustrates a membrane structure having integrated electroactive positioning actuators.

Referring now to the drawings, and more particularly to FIG. 1, a membrane structure according to the present invention is shown and referenced generally by the numeral 100. Membrane 110 is to be controlled. Membrane 110 can be of any shape. Supporting frame 140 supports the membrane 110. Supporting base 120 is connected to a strut assembly 130. Strut assembly 130 is connected to additional structure within the overall structural system. The supporting base 120/strut assembly 130 structure is indicative of usual support and overall system interface for membrane structures; however, the present invention is not limited to such specific configuration. Actuators 150, 160 and 170 are affixed to supporting base 120 adjacent to the supporting base 120 periphery. Actuators 150, 160 and 170 bend upon electrical activation. Electrostrictive actuators are preferred due to their high mechanical modulus and strain combination. An especially preferred actuator is the polymer-polymer actuator bed and claimed in "Polymer-Polymer Bilayer Actuator", Ser. No. 09/696,524, filed Oct. 23, 2000, hereby incorporated by reference. The actuators 150, 160 and 170 can also have non-uniform layer thickness, as that described in and claimed in "Non-Uniform Thickness Electroactive Device", Ser. No. 09/696,526, filed Oct. 23, 2000, hereby incorporated by reference.

Figure 2A:
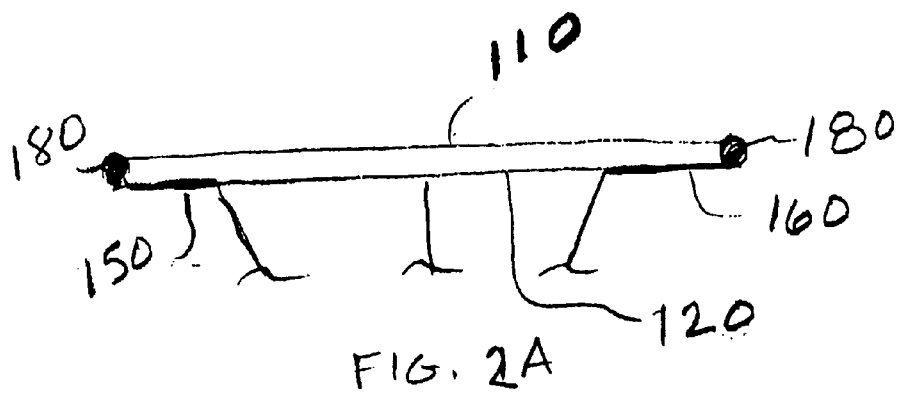
FIGS. 2A through 2D illustrate four positioning states of a membrane.
Figure 2B:
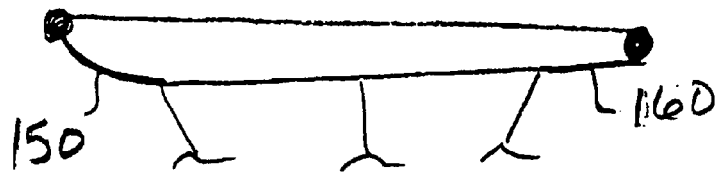
Figure 2C:
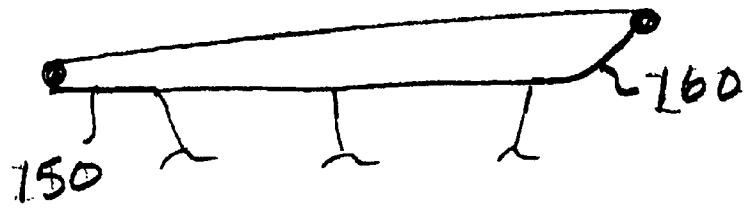
Figure 2D:
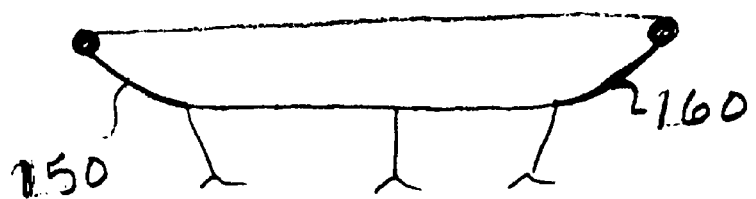

Referring to FIGS. 2A through 2D, connection means 180 operatively connects the membrane 110 and actuators 150 and 160. FIGS. 2A through 2D illustrate four positioning states of a membrane 110. The actuators are in their inactivated state in FIG. 2A. FIG. 2B illustrates tilting of the membrane 110 resulting from bending of the actuator 150. FIG. 2C illustrates tilting of the membrane 110 resulting from bending of the actuator 160. FIG. 2D illustrates a state in which the membrane 110 is raised as a result of bending by both of the actuators 150 and 160. The bending contour of each of the actuators 150 and 160 will depend upon their materials, their drive voltages, whether they have non-uniform layer thicknesses, as well as other variables, such as electroding methodology. For ease of illustration, displacements of only two actuators, 150 and 160, are shown. It should be understood that none, one, two or three actuators may be electrically activated at any time. The states shown are merely illustrative and positioning capability of each actuator is tailorable via the actuator design, placement and number. Furthermore, any number of actuators may be used, although the three-actuator placement is preferred to obtain the most stability and degrees of freedom.

Figure 3A:
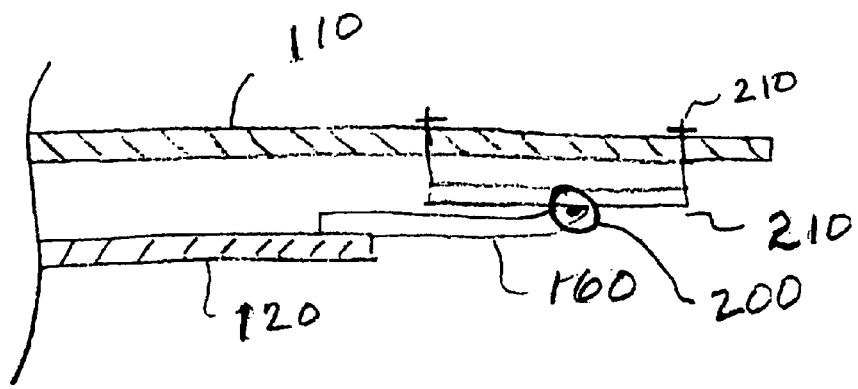
FIG. 3A illustrates a connection means operatively connecting the electroactive device to the membrane for controlling membrane position.
Figure 3B:
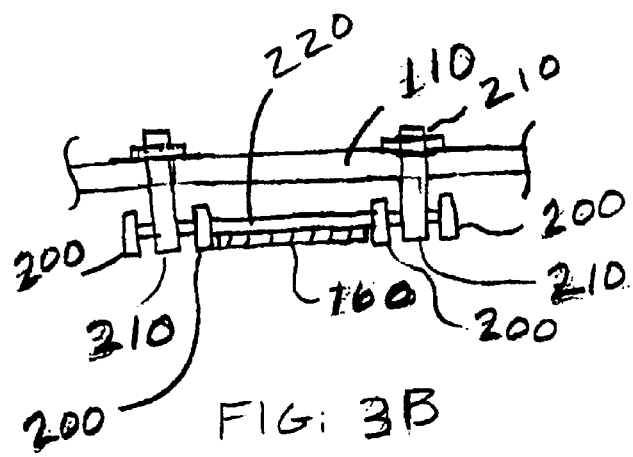
FIG. 3B illustrates a side view of FIG. 3A.
Figure 3C:
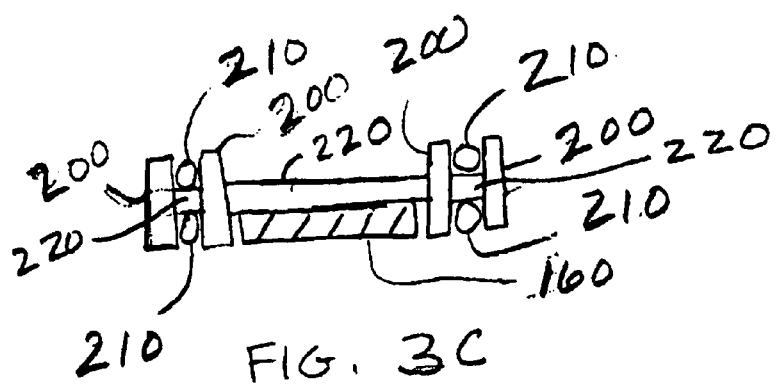
FIG. 3C illustrates a partial cross-sectional view of FIG. 3B.
Figure 4:
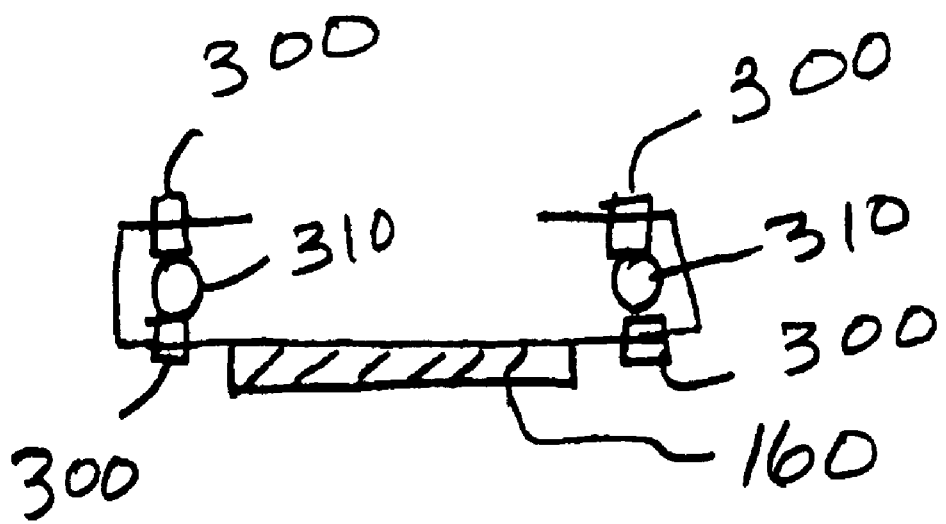
FIG. 4 is an alternate embodiment of the connection means.
Figure 2A:
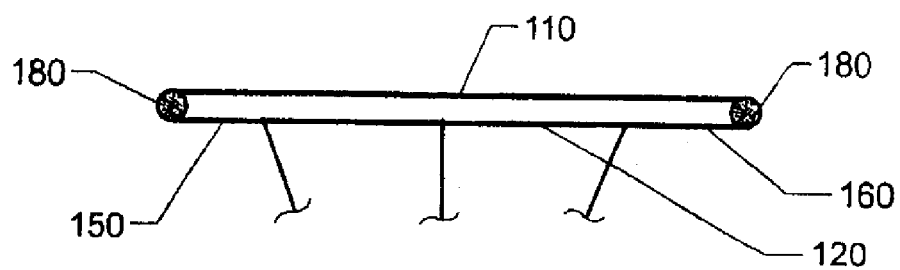
Figure 2B:
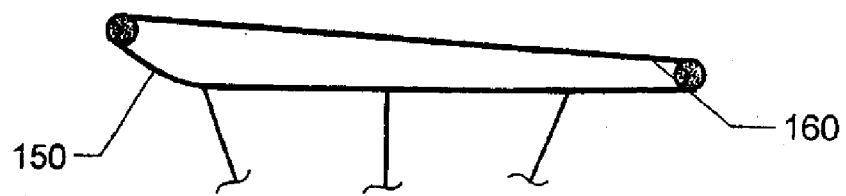
Figure 2C:
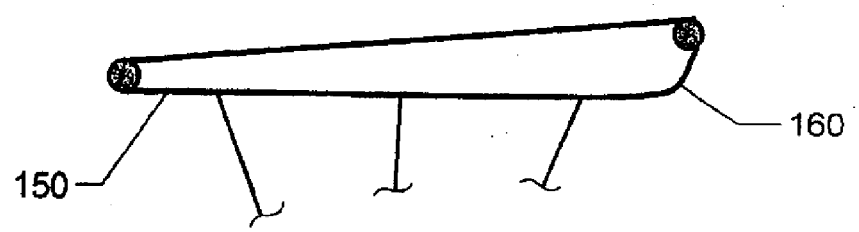
Figure 2D:
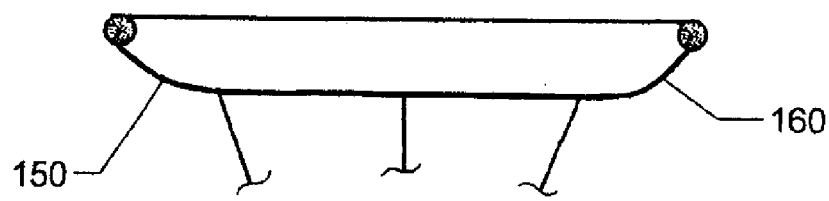
Figure 3A:
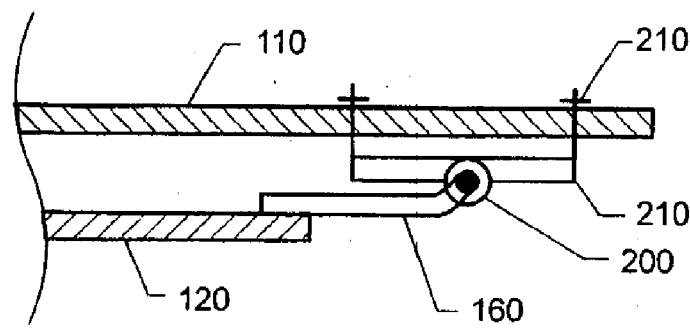
Figure 3B:
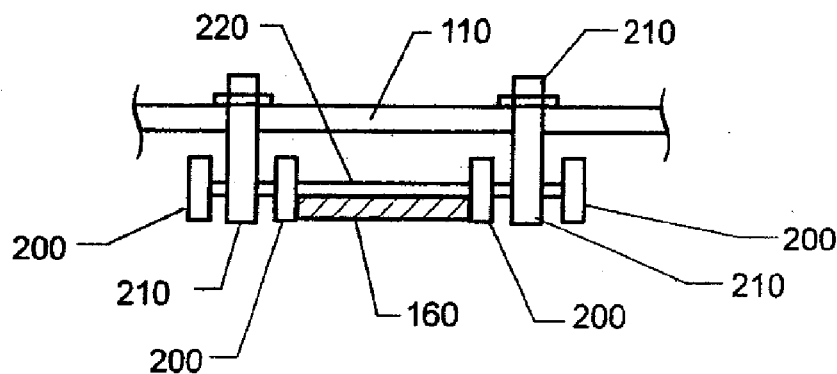
Figure 3C:
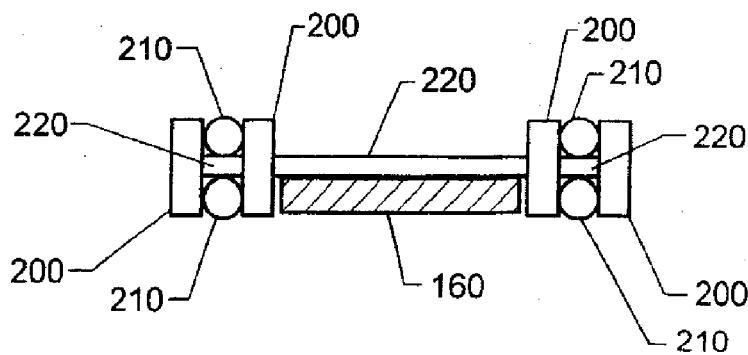
Figure 4:
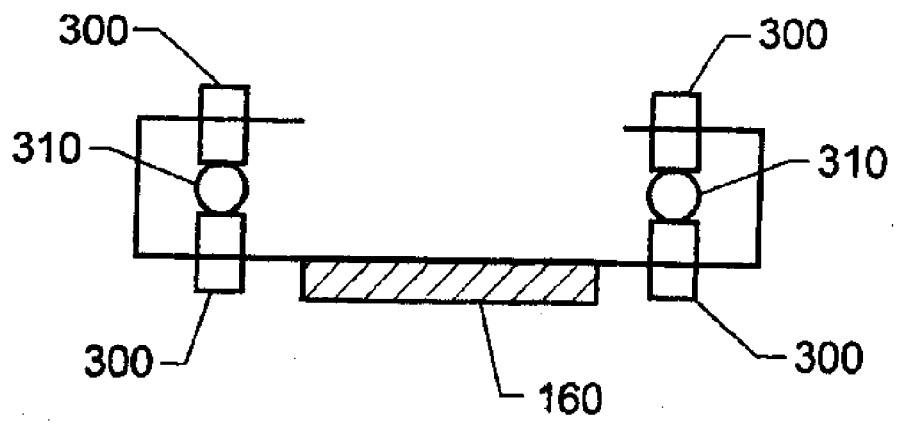

FIGS. 3A through 3B illustrate one embodiment of connection means 180. FIG. 3B is a side view of FIG. 3A. FIG. 3C illustrates a partial cross section of FIG. 3B. Bending actuator 160 is affixed to supporting base 120. Either chemical or mechanical means may be used. Chemical means are preferred, such as the chemical adhesive epoxy. The amount the actuator 160 overlaps the supporting base 120 depends on the affixation means employed. The size, including length, width and thickness, of the actuator also vary depending on the desired range of bending displacement that is desired and are selected accordingly. The actuator 160 is movably connected to membrane 110 via a guiding track 210 and guiding wheel assembly, wherein the guiding wheel assembly includes the guiding wheels 200 and axle 220. The guiding track 210 is affixed to the membrane 110 by chemical or mechanical means. Mechanical means are shown. The guiding wheels 200 maintain movement of the axle 220 along the guiding track 210, and are positioned along the axle 220 a sufficient distance from the guiding track 210 to allow free movement of the axle 220 along the guiding track 210. The guiding track 210 and guiding wheel assembly may be plastic, metal, or other suitable material. Plastic is preferred due its lower weight. Guiding axle 220 is affixed to the bending actuator 160 using chemical, such as epoxy, or mechanical, such as fastener, means. The connecting means 180 allows for rotation of the bending actuator 160 in a positive direction, i.e., in the direction towards the membrane, and back to its non-activated position. In operation, the bending actuator 160 responds to the output of one or more sensors located on membrane 110 via an integrated feedback control system. As the bending actuator 160 bends due to electrical activation from a drive voltage (not shown), the guiding wheels 200 translate along the guiding tracks 210, and displacement of the membrane 110 is effected. Another embodiment of the connection means 180 is illustrated in FIG. 4. In this embodiment, guiding track 310 guides upper and lower guiding wheels 300. Any connection means that effectively translates motion of the actuator 160 to the membrane 110 is acceptable.

Obviously, numerous additional modifications and variations of the present invention are possible in light of above teachings. It is therefore to be understood that within the scope of the appended claims, the invention may be practiced otherwise than is specifically described herein.

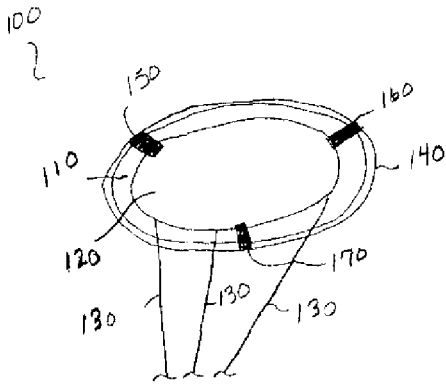

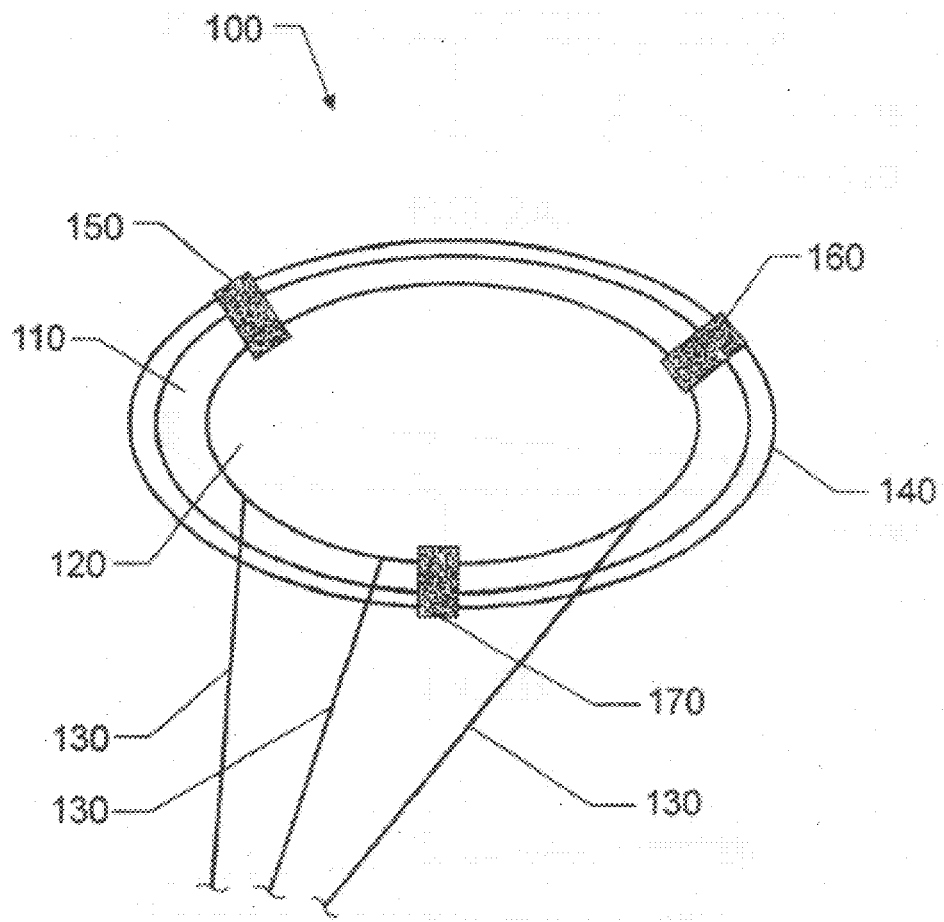

What is claimed is:

1. An electroactively controlled membrane structure, comprising:

a membrane whose position is to be controlled;

a supporting base;

at least one electroactively bending actuator affixed to the supporting base; and connection means corresponding to each of th at last one electroactive bending actuators for operatively connecting the membrane to each of the at least one electroactive bending actuators;

wherein displacement of the at least one electroactive bending actuator effects displacement of the membrane; and further wherein each connection means comprises a guiding wheel assembly and a track, wherein displacement of the actuator affects translation of the wheel assembly along the track, thereby imparting movement to the membrane.

2. An electroactively controlled membrane structure, comprising:

a membrane whose position is to be controlled;

a supporting base;

at least one electroactive bending actuator affixed to the supporting base; and connection means corresponding to each of the at least one electroactive bending actuators for operatively connecting the membrane to each of the at least one electroactive bending actuators;

wherein displacement of the at least one electroactive bending actuator effects displacement of the membrane; and further wherein each connection means comprises:

a guiding track affixed to the membrane;

a guiding wheel assembly, the guiding wheel assembly further comprising an axle, affixed to the electroactive bending actuator, and for guiding wheels which maintain movement of the axle along the guiding track;

whereby bending of the actuator effects displacement of the membrane.

3. The structure of claim 2, wherein the guiding track is affixed to the membrane by means selected from the group consisting of chemical and mechanical.

4. The structure of claim 2, wherein the guiding wheels are position a sufficient distance form the guiding track to allow free movement of the axle along the guiding track.

5. The structure of claim 2, wherein the guiding wheel assembly is made of a material selected from the group consisting of plastic and metal.

6. The structure of claim 2, wherein the guiding track is made of a material selected from the group consisting of plastic and metal.

* * * * *

UNITED STATES PATENT AND TRADEMARK OFFICE
CERTIFICATE OF CORRECTION

PATENT NO. : 6,724,130 B1
DATED : April 20, 2004
INVENTOR(S) : Ji Su et al.

It is certified that error appears in the above-identified patent and that said Letters Patent is hereby corrected as shown below:

The title page should be deleted and substitute therefor the attached title page as shown the attached page.

Drawings,
Replace informal figures 1 through 4 with formal figures 1 through 4 as shown on the attached pages.

Signed and Sealed this

Twenty-sixth Day of April, 2005

JON W. DUDAS
*Director of the United States Patent and Trademark Office*

(12) United States Patent
Su et al.

(10) Patent No.: US 6,724,130 B1
(45) Date of Patent: Apr. 20, 2004

(54) MEMBRANE POSITION CONTROL

(75) Inventors: Ji Su, Highland Park, NJ (US); Joycelyn S. Harrison, Hampton, VA (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 4 days.

(21) Appl. No.: 09/696,523

(22) Filed: Oct. 23, 2000

Related U.S. Application Data

(60) Provisional application No. 60/161,113, filed on Oct. 22, 1999.

(51) Int. Cl.[7] ............................................. H01L 41/08
(52) U.S. Cl. .................................... 310/330; 310/331
(58) Field of Search ................................. 310/328, 367, 310/368, 330, 331, 332, 324

(56) References Cited

U.S. PATENT DOCUMENTS

| | | | |
|---|---|---|---|
| 1,803,274 A | * | 4/1931 | Sawyer .................. 310/330 |
| 2,540,412 A | * | 2/1951 | Adler ..................... 310/330 |
| 2,842,685 A | * | 7/1958 | Peterman et al. ...... 310/331 |
| 2,900,536 A | * | 8/1959 | Palo ....................... 310/330 |
| 3,093,710 A | * | 6/1963 | Eycke .................... 310/330 |
| 3,146,367 A | * | 8/1964 | Mcnaney ................ 310/331 |
| 3,904,274 A | * | 9/1975 | Feinleib et al. ........ 310/328 |
| 3,928,778 A | * | 12/1975 | Ivanov et al. .......... 310/331 |
| 4,246,447 A | * | 1/1981 | Vorie ................... 179/110 A |
| 4,330,730 A | * | 5/1982 | Kurz et al. ............. 310/331 |
| 4,523,120 A | * | 6/1985 | Assard et al. ..... 310/331 X |
| 4,578,613 A | | 3/1986 | Posthuma de Boer et al. |
| 4,868,447 A | | 9/1989 | Lee et al. |
| 5,162,811 A | | 11/1992 | Lammers et al. |
| 5,338,997 A | * | 8/1994 | Benecke ............ 310/331 X |
| 5,414,564 A | * | 5/1995 | Pausch et al. .......... 359/846 |
| 5,440,320 A | | 8/1995 | Lach et al. |
| 5,598,050 A | * | 1/1997 | Bowen et al. .......... 310/322 |
| 5,689,380 A | * | 11/1997 | Um ........................ 310/328 |
| 5,886,811 A | * | 3/1999 | Min ........................ 359/291 |
| 6,074,067 A | | 6/2000 | Shimada |
| 6,076,770 A | | 6/2000 | Nygren |
| 6,098,349 A | | 8/2000 | Zheng |
| 6,131,698 A | | 10/2000 | Reyland |
| 6,188,160 B1 | * | 2/2001 | Main et al. ............. 310/317 |
| 6,293,682 B1 | * | 9/2001 | Kawaguchi ............ 359/871 |
| 6,297,579 B1 | * | 10/2001 | Martin et al. .......... 310/330 |

OTHER PUBLICATIONS

Carlin, "Lightweight Mirror Systems for Spacecraft—An Overview of Material & Manufacturing Needs," Sep. 2000, 2000 Areospace Conf. Proc. vol. 4 pp. 169–181.*

Y. Bar–Cohen et al, "NASA/JPL Workshop on Biomorphic Explorers for Future Missions", held at Jet Propulsion Labs, Pasadena, CA, Aug. 19–20, 1998, 22 pgs.

(List continued on next page.)

*Primary Examiner*—Mark Budd
(74) *Attorney, Agent, or Firm*—Robin W. Edwards

(57) ABSTRACT

A membrane structure includes at least one electroactive bending actuator fixed to a supporting base. Each electroactive bending actuator is operatively connected to the membrane for controlling membrane position. Any displacement of each electroactive bending actuator effects displacement of the membrane. More specifically, the operative connection is provided by a guiding wheel assembly and a track, wherein displacement of the bending actuator effects translation of the wheel assembly along the track, thereby imparting movement to the membrane.

6 Claims, 4 Drawing Sheets